(12) United States Patent
Xu

(10) Patent No.: US 11,996,506 B2
(45) Date of Patent: May 28, 2024

(54) DISPLAY PANEL AND ELECTRONIC DEVICE

(71) Applicant: Shenzhen China Star Optoelectronics Semiconductor Display Technology Co., Ltd., Guangdong (CN)

(72) Inventor: Jian Xu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/419,400

(22) PCT Filed: Jun. 1, 2021

(86) PCT No.: PCT/CN2021/097566
§ 371 (c)(1),
(2) Date: Jun. 29, 2021

(87) PCT Pub. No.: WO2022/236887
PCT Pub. Date: Nov. 17, 2022

(65) Prior Publication Data
US 2024/0030392 A1   Jan. 25, 2024

(30) Foreign Application Priority Data
May 14, 2021 (CN) .......................... 202110529713.7

(51) Int. Cl.
*H01L 33/62* (2010.01)
*G09G 3/32* (2016.01)
*H01L 25/075* (2006.01)

(52) U.S. Cl.
CPC ............... *H01L 33/62* (2013.01); *G09G 3/32* (2013.01); *H01L 25/0753* (2013.01)

(58) Field of Classification Search
CPC ........ H01L 33/62; H01L 25/0753; G09G 3/32
See application file for complete search history.

(56) References Cited

U.S. PATENT DOCUMENTS

2006/0044237 A1  3/2006  Lee et al.
2012/0050344 A1  3/2012  Kim et al.
(Continued)

FOREIGN PATENT DOCUMENTS

CN   104537985 A   4/2015
CN   106448562 A   2/2017
(Continued)

OTHER PUBLICATIONS

International Search Report in International application No. PCT/CN2021/097566, dated Feb. 10, 2022.
(Continued)

*Primary Examiner* — Victor A Mandala

(57) ABSTRACT

A display panel and an electronic device are provided. The display panel includes a first power supply voltage bonding terminal and a second power supply voltage bonding terminal; a first power line and a second power line; and a plurality of light-emitting units; wherein when resistance of a first part of the first power line is greater than resistance of a second part of the first power line, resistance of a first part of the second power line is less than resistance of a second part of the second power line, alleviating non-uniform display of the panel.

20 Claims, 4 Drawing Sheets

(56) References Cited

U.S. PATENT DOCUMENTS

| | | | |
|---|---|---|---|
| 2017/0330514 | A1 | 11/2017 | Yin et al. |
| 2019/0164482 | A1 | 5/2019 | Wang et al. |
| 2020/0161286 | A1* | 5/2020 | Park .................... H01L 25/167 |

FOREIGN PATENT DOCUMENTS

| | | | |
|---|---|---|---|
| CN | 206097868 | U | 4/2017 |
| CN | 108389880 | A | 8/2018 |
| CN | 109817643 | A | 5/2019 |
| CN | 110310976 | A | 10/2019 |
| CN | 110796980 | A | 2/2020 |
| EP | 1754213 | A2 | 2/2007 |
| JP | 2006065281 | A | 3/2006 |

OTHER PUBLICATIONS

Written Opinion of the International Search Authority in International application No. PCT/CN2021/097566, dated Feb. 10, 2022.
Chinese Office Action issued in corresponding Chinese Patent Application No. 202110529713.7 dated Feb. 11, 2022, pp. 1-9.

* cited by examiner

DISPLAY PANEL AND ELECTRONIC DEVICE

FIELD OF INVENTION

The present application relates to the field of display technology and especially to a display panel and an electronic device.

BACKGROUND OF INVENTION

Currently, light-emitting diode (LED) display panels adopt current drive. With resistance and voltage drop of wiring disposed on a glass substrate, the longer the wiring is, the greater the resistance produced would be. Different disposing method of the wiring on a display panel would render different voltage drops at different areas of the display panel, leading to non-uniform display of the entire display panel.

Therefore, in conventional display panel technology, there is a problem that wiring method of a display panel renders non-uniform resistance in the display panel, leading to non-uniform display of the display panel, which is in urgent need for improvement.

SUMMARY OF INVENTION

The present application provides a display panel and an electronic device to solve a technical problem of conventional organic light-emitting diode (OLED) display panels that wiring method of a display panel renders non-uniform resistance in the display panel, leading to non-uniform display of the display panel.

In order to solve the above-described problem, the present application provides a technical approach as follows:

Embodiments of the present application provide a display panel that includes a first power supply voltage bonding terminal and a second power supply voltage bonding terminal; a first power line and a second power line; and a plurality of light-emitting units including a first light-emitting unit and a second light-emitting unit adjacent to each other, wherein the first light-emitting unit is connected to the first power supply voltage bonding terminal through a first part of the first power line and connected to the second power supply voltage bonding terminal through a first part of the second power line, and the second light-emitting unit is connected to the first power supply voltage bonding terminal through a second part of the first power line and connected to the second power supply voltage bonding terminal through a second part of the second power line; wherein when resistance of the first part of the first power line is greater than resistance of the second part of the first power line, resistance of the first part of the second power line is less than resistance of the second part of the second power line.

In one embodiment of the present application, the first power supply voltage bonding terminal and the second power supply voltage bonding terminal are located on different sides of the display panel.

In one embodiment of the present application, the first power supply voltage bonding terminal and the second power supply voltage bonding terminal are located on opposite sides of the display panel, the first power line includes a plurality of first sub-power lines, the second power line includes a plurality of second sub-power lines, each of the first sub-power lines is parallel to a corresponding second sub-power line, and the first light-emitting unit and the second light-emitting unit are connected between a same first sub-power line and a same second sub-power line. In one embodiment of the present application, the first power supply voltage bonding terminal and the second power supply voltage bonding terminal are located on a first side and a second side of the display panel adjacent to each other, respectively, the first power line includes a plurality of first sub-power lines disposed with intersection, the plurality of first sub-power lines include a plurality of first connecting nodes, in a direction from the first side pointing to an opposite side of the first side and in a direction from the second side pointing to an opposite side of the second side, a number of the plurality of first connecting nodes increases sequentially, the second power line includes a plurality of second sub-power lines disposed with intersection, the plurality of second sub-power lines include a plurality of second connecting nodes, in the direction from the first side pointing to the opposite side of the first side and in the direction from the second side pointing to the opposite side of the second side, a number of the plurality of second connecting nodes increases sequentially, and the first light-emitting unit and the second light-emitting unit are connected to a corresponding first sub-power line and a corresponding second sub-power line. In one embodiment of the present application, the first power supply voltage bonding terminal and the second power supply voltage bonding terminal are located on a same side of the display panel.

In one embodiment of the present application, the first power line includes a plurality of first sub-power lines, the second power line includes a plurality of second sub-power lines in parallel, each of the first sub-power lines is parallel to a corresponding second sub-power line, and the first light-emitting unit and the second light-emitting unit are connected between a corresponding first sub-power line and a corresponding second sub-power line. In one embodiment of the present application, the display panel includes a third side and a fourth side adjacent to the same side, the third side is disposed opposite to the fourth side, the first power line includes a plurality of first sub-power lines disposed with intersection, the plurality of first sub-power lines include a plurality of first connecting nodes, in a direction from the same side pointing to an opposite side of the same side and in a direction from the third side pointing to the fourth side, a number of the plurality of first connecting nodes increases sequentially, the second power line includes a plurality of second sub-power lines disposed with intersection, the plurality of second sub-power lines include a plurality of second connecting nodes, and in the direction from the same side pointing to the opposite side of the same side and in a direction from the fourth side pointing to the third side, a number of the plurality of second connecting nodes increases sequentially.

In one embodiment of the present application, the first power line and the second power line are located in a display area of the display panel.

In one embodiment of the present application, further including a driving chip, wherein the first power supply voltage bonding terminal and the second power supply voltage bonding terminal are connected to the driving chip through a fan-out wiring, and each of the light-emitting units is a light-emitting diode.

Embodiments of the present application further provide an electronic device that includes a first power supply voltage bonding terminal and a second power supply voltage bonding terminal; a first power line and a second power line; and a plurality of light-emitting units including a first light-emitting unit and a second light-emitting unit adjacent to each other, wherein the first light-emitting unit is connected to the first power supply voltage bonding terminal through a first part of the first power line and connected to the second power supply voltage bonding terminal through a first part of the second power line, and the second light-emitting unit is connected to the first power supply voltage bonding terminal through a second part of the first power line and connected to the second power supply voltage bonding terminal through a second part of the second power line; wherein when resistance of the first part of the first power line is greater than resistance of the second part of the first power line, resistance of the first part of the second power line is less than resistance of the second part of the second power line.

In one embodiment of the present application, the first power supply voltage bonding terminal and the second power supply voltage bonding terminal are located on different sides of the display panel.

In one embodiment of the present application, the first power supply voltage bonding terminal and the second power supply voltage bonding terminal are located on opposite sides of the display panel, the first power line includes a plurality of first sub-power lines, the second power line includes a plurality of second sub-power lines, each of the first sub-power lines is parallel to a corresponding second sub-power line, and the first light-emitting unit and the second light-emitting unit are connected between a same first sub-power line and a same second sub-power line.

In one embodiment of the present application, the first power supply voltage bonding terminal and the second power supply voltage bonding terminal are located on a first side and a second side of the display panel adjacent to each other, respectively, the first power line includes a plurality of first sub-power lines disposed with intersection, the plurality of first sub-power lines include a plurality of first connecting nodes, in a direction from the first side pointing to an opposite side of the first side and in a direction from the second side pointing to an opposite side of the second side, a number of the plurality of first connecting nodes increases sequentially, the second power line includes a plurality of second sub-power lines disposed with intersection, the plurality of second sub-power lines include a plurality of second connecting nodes, in the direction from the first side pointing to the opposite side of the first side and in the direction from the second side pointing to the opposite side of the second side, a number of the plurality of second connecting nodes increases sequentially, and the first light-emitting unit and the second light-emitting unit are connected to a corresponding first sub-power line and a corresponding second sub-power line.

In one embodiment of the present application, the first power supply voltage bonding terminal and the second power supply voltage bonding terminal are located on a same side of the display panel.

In one embodiment of the present application, the first power line includes a plurality of first sub-power lines, the second power line includes a plurality of second sub-power lines in parallel, each of the first sub-power lines is parallel to a corresponding second sub-power line, and the first light-emitting unit and the second light-emitting unit are connected between a corresponding first sub-power line and a corresponding second sub-power line.

In one embodiment of the present application, the display panel includes a third side and a fourth side adjacent to the same side, the third side is disposed opposite to the fourth side, the first power line includes a plurality of first sub-power lines disposed with intersection, the plurality of first sub-power lines include a plurality of first connecting nodes, in a direction from the same side pointing to an opposite side of the same side and in a direction from the third side pointing to the fourth side, a number of the plurality of first connecting nodes increases sequentially, the second power line includes a plurality of second sub-power lines disposed with intersection, the plurality of second sub-power lines include a plurality of second connecting nodes, and in the direction from the same side pointing to the opposite side of the same side and in a direction from the fourth side pointing to the third side, a number of the plurality of second connecting nodes increases sequentially.

In one embodiment of the present application, the first power line and the second power line are located in a display area of the display panel.

In one embodiment of the present application, further including a driving chip, wherein the first power supply voltage bonding terminal and the second power supply voltage bonding terminal are connected to the driving chip through a fan-out wiring, and each of the light-emitting units is a light-emitting diode.

In one embodiment of the present application, the display panel is a light-emitting diode display panel.

In one embodiment of the present application, the first power line is led into the display panel through the first power supply voltage bonding terminal, and the second power line is led into the display panel through the second power supply voltage bonding terminal.

The present application provides a display panel and an electronic device. The display panel includes a first power supply voltage bonding terminal and a second power supply voltage bonding terminal; a first power line and a second power line; and a plurality of light-emitting units comprising a first light-emitting unit and a second light-emitting unit adjacent to each other, wherein the first light-emitting unit is connected to the first power supply voltage bonding terminal through a first part of the first power line and connected to the second power supply voltage bonding terminal through a first part of the second power line, and the second light-emitting unit is connected to the first power supply voltage bonding terminal through a second part of the first power line and connected to the second power supply voltage bonding terminal through a second part of the second power line; wherein when resistance of the first part of the first power line is greater than resistance of the second part of the first power line, resistance of the first part of the second power line is less than resistance of the second part of the second power line to reduce voltage drop difference of power lines between adjacent light-emitting units, thereby alleviating non-uniform display of the display panel.

DETAILED DESCRIPTION OF EMBODIMENTS

The embodiments of the present invention are described in detail hereinafter. Examples of the described embodiments are given in the accompanying drawings. It should be noted that the following embodiments are intended to illustrate and interpret the present invention, and shall not be construed as causing limitations to the present invention. Similarly, the following embodiments are part of the embodiments of the present invention and are not the whole embodiments, and all other embodiments obtained by those skilled in the art without making any inventive efforts are within the scope protected by the present invention.

In description of embodiments of the present invention, it should be understood that terms that indicates orientation or relation of position such as "center", "longitudinal", "lateral", "length", "width", "thickness", "upper", "lower", "front", "rear", "left", "right", "vertical", "horizontal", "top", "bottom", "interior", "exterior" are based on orientation or relation of position accompanying drawings show. They are simply for purpose of description of the present invention and simplifying of description, and do not mean or suggest the devices or components have a specified orientation and constructed and operated in a specified orientation; therefore, it should not be understood as limitation of the present invention. Furthermore, terms "first", "second", and "third" are used simply for purpose of description and cannot be understood to mean or suggest relative importance or implicitly mean amount of the technical features. Therefore, features with terms "first", "second", and "third" can mean or implicitly include one or more of the features. In description of the present invention, "multiple" means two or more unless otherwise clearly and concretely specified.

Referring to FIG. 1 to FIG. 7, the present application provides a display panel and an electronic device.

Currently, light-emitting diode (LED) display panels adopt current drive. With resistance and voltage drop of wiring disposed on a glass substrate, the longer the wiring is, the greater the resistance produced would be. Different disposing method of the wiring on a display panel would render different voltage drops at different areas of the display panel, leading to non-uniform display of display images of the entire display panel. Therefore, the present application provides a display panel and an electronic device to solve the above-described problem.

Figure 1:
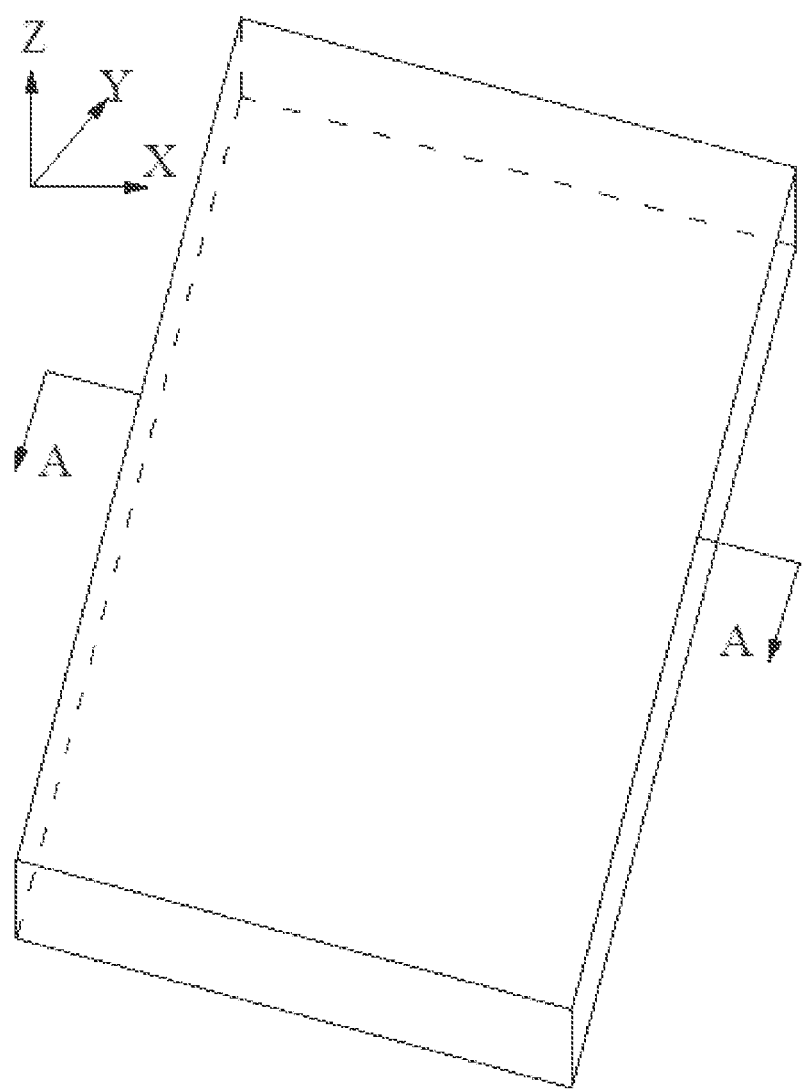
FIG. 1 is a first structural schematic diagram of a display panel according to embodiments of the present application.

Referring to FIG. 1, FIG. 1 is a first structural schematic diagram of a display panel according to embodiments of the present application. In one aspect, the present application provides a display panel. First, the display panel is an LED display panel, and it can also be a mini-LED display panel or a micro-LED display panel. Referring to FIG. 1, the display panel is generally a cuboid, but it is not limited to a cuboid, and can be various other shapes. Eight corners of the display panel are round corners to prevent inconvenience during installation, moving, or using by users or even cutting finger skin.

Wherein, a first direction X is on a display surface of the display panel and parallel to one side of the display surface of the display panel. A second direction Y is on the same surface as the first direction X and perpendicular to the first direction. A third direction Z is perpendicular to the display surface of the display panel and simultaneously perpendicular to the second direction Y and the first direction X.

Figure 2:
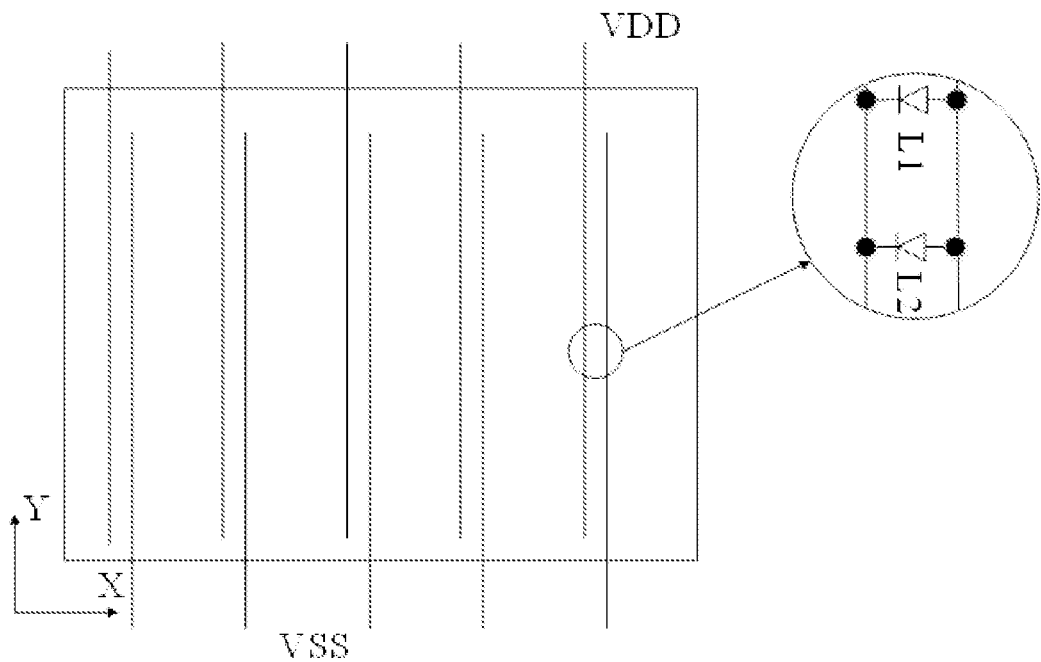
FIG. 2 is a second structural schematic diagram of the display panel according to embodiments of the present application.
Figure 3:
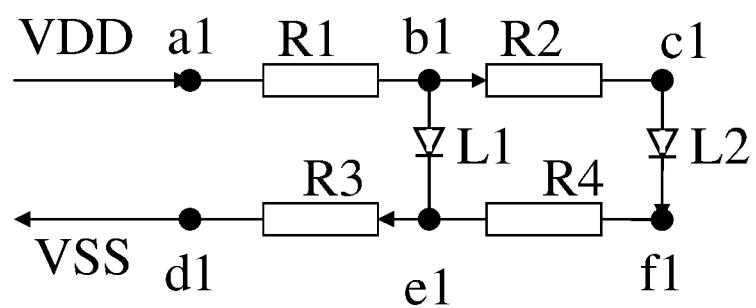
FIG. 3 is a first structural schematic diagram of circuit wiring in the display panel according to embodiments of the present application.

Referring to FIG. 2, FIG. 2 is a second structural schematic diagram of the display panel according to embodiments of the present application, and it is also a sectional view of the display panel of FIG. 1 along line A-A. The display panel includes a first power supply voltage bonding terminal and a second power supply voltage bonding terminal, a first power line and a second power line, and a plurality of light-emitting units including a first light-emitting unit L1 and a second light-emitting unit L2 adjacent to each other, wherein the first light-emitting unit L1 is connected to the first power supply voltage bonding terminal through a first part of the first power line and connected to the second power supply voltage bonding terminal through a first part of the second power line, and the second light-emitting unit L2 is connected to the first power supply voltage bonding terminal through a second part of the first power line and connected to the second power supply voltage bonding terminal through a second part of the second power line. Wherein, when resistance of the first part of the first power line is greater than resistance of the second part of the first power line, resistance of the first part of the second power line is less than resistance of the second part of the second power line.

It can be understood that the first power line is led into the display panel through the first power supply voltage bonding terminal, and the second power line is led into the display panel through the second power supply voltage bonding terminal. The first power line and the second power line are parallelly disposed in the first direction or the second direction. The plurality of light-emitting units are disposed between the first power line and the second power line, including the first light-emitting unit L1 and the second light-emitting unit L2 adjacent to each other. The first part of the first power line is a power line between the first power supply voltage bonding terminal and the first light-emitting unit L1, and the second part of the first power line is a power line between the first part of the first power line and the second light-emitting unit L2. The first part of the second power line is a power line between the second power supply voltage bonding terminal and the first light-emitting unit L1, and the second part of the second power line is a power line between the first part of the second power line and the second light-emitting unit L2. That is, the first power supply voltage bonding terminal is an input terminal of the first power line, and the second power supply voltage bonding terminal is an input terminal of the second power line. When resistance of the first part of the first power line is greater than resistance of the second part of the first power line, resistance of the first part of the second power line is less than resistance of the second part of the power line, such that wiring resistance of various areas of the display panel is approximately equal, alleviating non-uniform display of the display panel. Specifically, referring to FIG. 3, the first power line and the second power line separately input into the display panel on one side of the display panel, i.e., the input terminal of the first power line and the input terminal of the second power line are separately disposed on opposite sides of the display panel. A first resistance R1 is between a first node a1 and a second node b1, a second resistance R2 is between the second node b1 and a third node c1, and the first resistance R1 is greater than the second resistance R2, i.e., R1>R2. A third resistance R3 is between a fourth node d1 and a fifth node e1, a fourth resistance R4 is between the fifth node e1 and a sixth node f1, and the third resistance R3 is less than the fourth resistance R4, i.e., R3<R4. Furthermore, when current and voltage input by the first power line is equal to current and voltage input by the second power line, and thickness of the first power line is equal to thickness of the second power line, the first resistance R1 is approximately equal to the fourth resistance R4 and the second resistance R2 is approximately equal to the third resistance R3, i.e., R1≈R4 and R2≈R3, which implies R1+R2≈R3+R4.

In other words, the display panel includes a first power supply voltage bonding terminal and a second power supply voltage bonding terminal, and a first power line and a second power line, wherein the first power line includes an input terminal of the first power line and an output terminal of the first power line, the second power line includes an input terminal of the second power line and an output terminal of the second power line, the first power supply voltage bonding terminal is connected to the first power line, the second power supply voltage bonding terminal is connected to the second power line, the first power line is disposed opposite to the second power line, the first power line is disposed parallel to the second power line in at least one direction, the output terminal of the first power line outputs on a first side of the display panel, the output terminal of the second power line outputs on a second side of the display panel, and the first side is different from the second side.

It can be understood that the first power line is input by a common voltage VSS, and the second power line is input by an operating voltage VDD. The input terminal of the first power line and the output terminal of the first power line are located on different sides of the display panel, and the input terminal of the second power line and the output terminal of the second power line are located on different sides of the display panel. However, there is also a situation where the input terminal of the first power line and the output terminal of the first power line are located on a same side of the display panel, and the input terminal of the second power line and the output terminal of the second power line are located on a same side of the display panel. The first power line is disposed opposite to the first power line to ensure approximately equal current and wiring resistance in a same area, alleviating non-uniform display of the display panel. The first power line is disposed parallel to the second power line in at least one direction, i.e., the first power line and the second power line both include a plurality of power lines parallelly disposed in one direction or two directions. For example, the first power line and the second power line include a plurality of power lines parallelly disposed in one direction, or the first power line and the second power line include a plurality of power lines parallelly disposed in two different directions. Furthermore, the output terminal of the first power line outputs on the first side of the display panel, the second power line outputs on the second side of the display panel, and the first side and the second side are different sides of the display panel.

Furthermore, the first power supply voltage bonding terminal and the second power supply voltage bonding terminal are located on different sides of the display panel.

It can be understood that the input terminal of the first power line and the input terminal of the second power line are located on different sides of the display panel to alleviate a problem of non-uniform wiring resistance of various areas of the display panel.

Furthermore, the first power supply voltage bonding terminal and the second power supply voltage bonding terminal are located on opposite sides of the display panel. The first power line includes a plurality of first sub-power lines, the second power line includes a plurality of second sub-power lines, each of the first sub-power lines is parallel to a corresponding second sub-power line, and the first light-emitting unit L1 and the second light-emitting unit L2 are connected between a same first sub-power line and a same second sub-power line.

It can be understood that, in one embodiment, the input terminal of the first power line and the input terminal of the second power line are located on opposite sides of the display panel. The first power line includes the plurality of first sub-power lines parallelly disposed in the second direction Y, the second power line includes the plurality of second sub-power lines parallelly disposed in the second direction Y, each of the first sub-power lines is parallel to a corresponding second sub-power line, and the first light-emitting unit L1 and the second light-emitting unit L2 are connected between a same first sub-power line and a same second sub-power line. In another embodiment, the input terminal of the first power line and the input terminal of the second power line are located on opposite sides of the display panel. The first power line includes the plurality of first sub-power lines parallelly disposed in the first direction X, the second power line includes the plurality of second sub-power lines parallelly disposed in the first direction X, each of the first sub-power lines is parallel to a corresponding second sub-power line, and the first light-emitting unit L1 and the second light-emitting unit L2 are connected between a same first sub-power line and a same second sub-power line.

Furthermore, the first power supply voltage bonding terminal and the second power supply voltage bonding terminal are located on a first side and a second side of the display panel adjacent to each other, respectively. The first power line includes the plurality of first sub-power lines disposed with intersection, the plurality of first sub-power lines include a plurality of first connecting nodes, and in a direction from the first side pointing to an opposite side of the first side and in a direction from the second side pointing to an opposite side of the second side, a number of the plurality of first connecting nodes increases sequentially. The second power line includes the plurality of second sub-power lines disposed with intersection, the plurality of second sub-power lines include a plurality of second connecting nodes, and in a direction from the first side pointing to an opposite side of the first side and in a direction from the second side pointing to an opposite side of the second side, a number of the plurality of second connecting nodes increases sequentially. The first light-emitting unit L1 and the second light-emitting unit L2 are connected to a corresponding first sub-power line and a corresponding second sub-power line.

Figure 4:
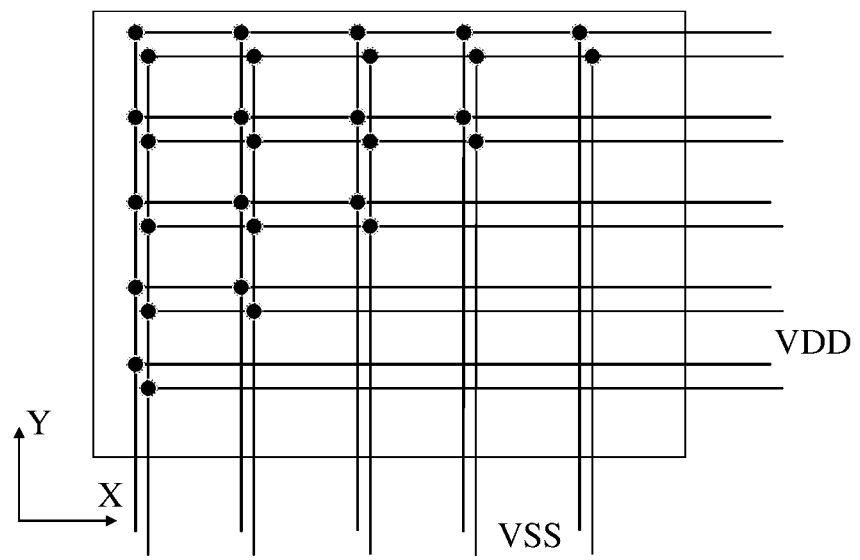
FIG. 4 is a third structural schematic diagram of the display panel according to embodiments of the present application.

It can be understood that, referring to FIG. 4, the input terminal of the first power line and the input terminal of the second power line are located on the first side and the second side of the display panel adjacent to each other, respectively. The first power line includes the plurality of first sub-power lines disposed with intersection, i.e., the first sub-power lines in the first direction and the first sub-power lines in the second direction, the plurality of first sub-power lines include the plurality of first connecting nodes, and in a direction from the first side pointing to an opposite side of the first side and in a direction from the second side pointing to an opposite side of the second side, a number of the plurality of first connecting nodes increases sequentially. In other words, at each of the first connecting nodes, the first sub-power lines in the first direction are in parallel with the first sub-power lines in the second direction, i.e., wiring resistance of the first sub-power line within this interval is in parallel, which is less than original wiring resistance that is in series. Originally, wiring resistance close to the input terminal of the first power line is greater than wiring resistance away from the input terminal of the first power line. When the first sub-power lines away from the input terminal of the first power line are in parallel, wiring resistance away from the input terminal of the first power line is decreased, alleviating non-uniform wiring resistance of the entire first power line in the display panel. When a number of the first connecting nodes away from the input terminal of the first power line is greater than a number of the first connecting nodes close to the input terminal of the first power line, wiring resistance of the first power line in the entire display panel is further balanced, alleviating non-uniform display of the display panel. The second power line includes the plurality of second sub-power lines disposed with intersection, the plurality of second sub-power lines include the plurality of second connecting nodes, and in a direction from the first side pointing to an opposite side of the first side and in a direction from the second side pointing to an opposite side of the second side, a number of the plurality of second connecting nodes increases sequentially. Similarly, wiring resistance of the second sub-power line within this interval is in parallel, which is less than original wiring resistance that is in series. Originally, wiring resistance close to the input terminal of the second power line is greater than wiring resistance away from the input terminal of the second power line. When the second sub-power lines away from the input terminal of the second power line are in parallel, wiring resistance away from the input terminal of the second power line is decreased, alleviating non-uniform wiring resistance of the entire second power line in the display panel. When a number of the second connecting nodes away from the input terminal of the second power line is greater than a number of the second connecting nodes close to the input terminal of the second power line, wiring resistance of the second power line in the entire display panel is further balanced, alleviating non-uniform display of the display panel. The first light-emitting unit L1 and the second light-emitting unit L2 are connected to a corresponding first sub-power line and a corresponding second sub-power line.

Furthermore, the first power supply voltage bonding terminal and the second power supply voltage bonding terminal are located on a same side of the display panel.

It can be understood that the input terminal of the first power line and the input terminal of the second power line are located on a same side of the display panel.

Furthermore, the first power line includes the plurality of first sub-power lines, the second power line includes the plurality of second sub-power lines in parallel, each of the first sub-power lines is parallel to a corresponding second sub-power line, and the first light-emitting unit L1 and the second light-emitting unit L2 are connected between a corresponding first sub-power line and a corresponding second sub-power line.

Figure 5:
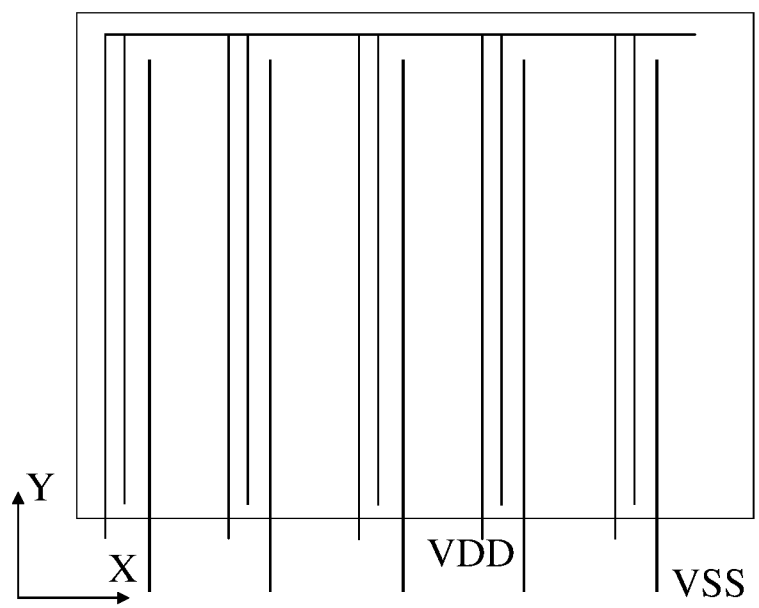
FIG. 5 is a fourth structural schematic diagram of the display panel according to embodiments of the present application.
Figure 6:
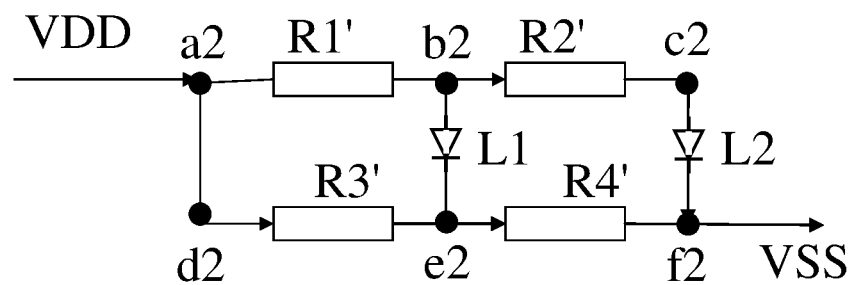
FIG. 6 is a second structural schematic diagram of the circuit wiring in the display panel according to embodiments of the present application.

It can be understood that, referring to FIG. 5, the first power line includes the plurality of first sub-power lines, the second power line includes the plurality of second sub-power lines in parallel, each of the first sub-power lines is parallel to a corresponding second sub-power line, a length of the second sub-power lines disposed parallel to the first sub-power lines is a second length L2, a length of the first sub-power lines is a first length L1, and the second length L2 is twice the first length L1, i.e., L2=2L1, to improve wiring resistance of various areas of the display panel. On a side away from a second sub-power supply voltage bonding terminal of all of the second sub-power lines, one of the second sub-power lines is in parallel with all of the second sub-power lines, and therefore wiring resistance of the second sub-power lines is in parallel, decreasing wiring resistance of the display panel. In other words, in one embodiment, the second sub-power line in the first direction X is in parallel with all of the second sub-power lines in the second direction Y. In another embodiment, the second sub-power line in the second direction Y is in parallel with all of the second sub-power lines in the first direction X. The first light-emitting unit L1 and the second light-emitting unit L2 are connected between the parallelly disposed first sub-power lines and their corresponding second sub-power lines. Specifically, referring to FIG. 6, when the first power line and the second power line both input on a same side of the display panel, i.e., the input terminal of the first power line and the input terminal of the second power line are both located on a same side of the display panel, a resistance between a first node a2 and a second node b2 is a first resistance R1', and a resistance between the second node b2 and a third node c2 is a second resistance R2'. Because the second length of the second power line is twice the first length of the first power line, i.e., L2=2L1, and the first power line and the second power line both input into the display panel on the same side of the display panel, the first resistance R1' is greater than the second resistance R2', i.e., R1'>R2'. A resistance between a fourth node d2 and a fifth node e2 is a third resistance R3', and a resistance between the fifth node e2 and a sixth node f2 is a fourth resistance R4'. Because the sixth node f2 is farther from the first power supply voltage bonding terminal than the fourth node d2, the third resistance R3' is less than the fourth resistance R4', i.e., R3' <R4'. When current and voltage input from the first power line and current and voltage input from the second power line are equal, and thickness of the first power line and thickness of the second power line are equal, the first resistance R1' is approximately equal to the fourth resistance R4', and the second resistance R2' is approximately equal to the third resistance R3', i.e., R1'≈R4' and R2'≈R3', which implies R1'+R2'≈R3'+R4'. Therefore, wiring resistance of various areas of the display panel is approximately equal, thereby alleviating non-uniform display of the display panel.

Furthermore, the display panel includes a third side and a fourth side adjacent to the same side, and the third side is disposed opposite to the fourth side. The first power line includes the plurality of first sub-power lines disposed with intersection, the plurality of first sub-power lines include a plurality of first connecting nodes, and in a direction from the same side pointing to an opposite side of the same side and in a direction from the third side pointing to the fourth side, a number of the plurality of first connecting nodes increases sequentially. The second power line includes the plurality of second sub-power lines disposed with intersection, the plurality of second sub-power lines include a plurality of second connecting nodes, and in a direction from the same side pointing to an opposite side of the same side and in a direction from the fourth side pointing to the third side, a number of the plurality of second connecting nodes increases sequentially.

Figure 7:
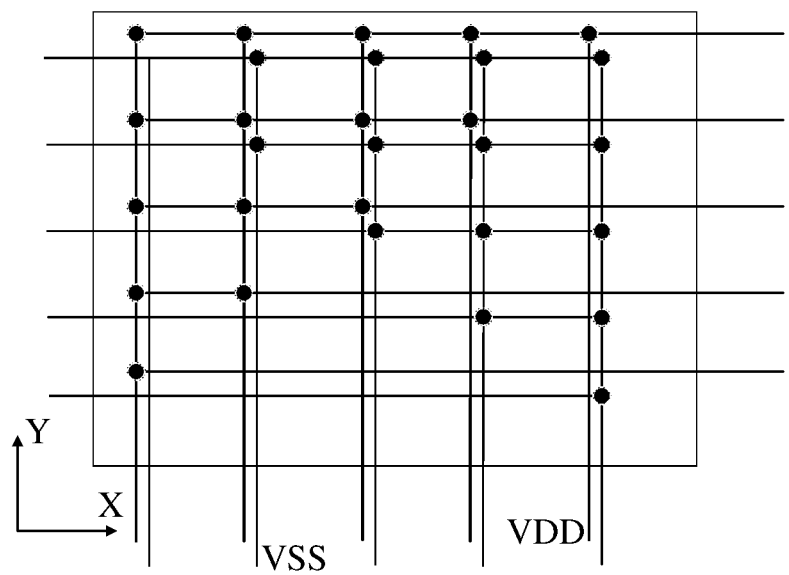
FIG. 7 is a fifth structural schematic diagram of the display panel according to embodiments of the present application.

It can be understood that, referring to FIG. 7, the display panel includes the third side and the fourth side adjacent to the same side, and the third side is disposed opposite to the fourth side. Wherein, the same side is an input side of the first power line and the second power line of the display panel, and the third side and the fourth side are both adjacent to the input side of the first power line and the second power line. The first power line includes the plurality of first sub-power lines disposed with intersection, the plurality of first sub-power lines include the plurality of first connecting nodes, i.e., the first sub-power lines include the first sub-power lines in the first direction X and the first sub-power lines in the second direction Y, the first sub-power lines in the first direction X and the first sub-power lines in the second direction Y are located in different film layers of the display panel, and the first connecting nodes are points of intersection between the first sub-power lines in the first direction and the first sub-power lines in the second direction. In a direction from the same side pointing to an opposite side of the same side and in a direction from the third side pointing to the fourth side, a number of the plurality of first connecting nodes increases sequentially. The second power line includes the plurality of second sub-power lines disposed with intersection, and the plurality of second sub-power lines include the plurality of second connecting nodes. Similarly, the second sub-power lines include the second sub-power lines in the first direction X and the second sub-power lines in the second direction Y, the second sub-power lines in the first direction X and the second sub-power lines in the second direction Y are located in different film layers of the display panel, and the second connecting nodes are points of intersection between the second sub-power lines in the first direction and the second sub-power lines in the second direction. In a direction from the same side pointing to an opposite side of the same side and in a direction from the fourth side pointing to the third side, a number of the plurality of second connecting nodes increases sequentially. Similar to the embodiment shown in FIG. 4, at each of the first connecting nodes/the second connecting nodes, the first sub-power lines/the second sub-power lines in the first direction are in parallel with the first sub-power lines/the second sub-power lines in the second direction, i.e., wiring resistance of the first sub-power line/the second sub-power line within this interval is in parallel, which is less than original wiring resistance that is in series. Originally, wiring resistance close to the input terminal of the first power line/the second power line is greater than wiring resistance away from the input terminal of the first power line/the second power line. When the first sub-power lines/the second sub-power lines away from the input terminal of the first power line/the second power line are in parallel, wiring resistance away from the input terminal of the first power line/the second power line is decreased, alleviating non-uniform wiring resistance of the entire first power line in the display panel. When a number of the first connecting nodes/the second connecting nodes away from the input terminal of the first power line/the second power line is greater than a number of the first connecting nodes/the second connecting nodes close to the input terminal of the first power line/the second power line, wiring resistance of the first power line/the second power line in the entire display panel is further balanced, alleviating non-uniform display of the display panel.

Furthermore, the first power line and the second power line are located in a display area of the display panel to ensure normal display of the display area of the display panel.

Furthermore, the display panel further includes a driving chip, the first power supply voltage bonding terminal and the second power supply voltage bonding terminal are connected to the driving chip through a fan-out wiring, and each of the light-emitting units is a light-emitting diode.

Wherein, the driving chip is configured to control on and off of the first power line and the second power line and control functions of other wirings and components of the display panel to ensure normal display of the display panel.

On the other hand, embodiments of the present application further provide an electronic device, and the electronic device includes any of the display panels described above.

Although the present application has been explained in relation to its preferred embodiment, it does not intend to limit the present application. It will be apparent to those skilled in the art having regard to this present application that other modifications of the exemplary embodiments beyond these embodiments specifically described here may be made without departing from the spirit of the application. Accordingly, such modifications are considered within the scope of the application as limited solely by the appended claims.

What is claimed is:

1. A display panel, comprising:
a first power supply voltage bonding terminal and a second power supply voltage bonding terminal;
a first power line and a second power line; and
a plurality of light-emitting units comprising a first light-emitting unit and a second light-emitting unit adjacent to each other, wherein the first light-emitting unit is connected to the first power supply voltage bonding terminal through a first part of the first power line and connected to the second power supply voltage bonding terminal through a first part of the second power line, and the second light-emitting unit is connected to the first power supply voltage bonding terminal through a second part of the first power line and connected to the second power supply voltage bonding terminal through a second part of the second power line;
wherein when resistance of the first part of the first power line is greater than resistance of the second part of the first power line, resistance of the first part of the second power line is less than resistance of the second part of the second power line.

2. The display panel as claimed in claim 1, wherein the first power supply voltage bonding terminal and the second power supply voltage bonding terminal are located on different sides of the display panel.

3. The display panel as claimed in claim 2, wherein the first power supply voltage bonding terminal and the second power supply voltage bonding terminal are located on opposite sides of the display panel, the first power line comprises a plurality of first sub-power lines, the second power line comprises a plurality of second sub-power lines, each of the first sub-power lines is parallel to a corresponding second sub-power line, and the first light-emitting unit and the second light-emitting unit are connected between a same first sub-power line and a same second sub-power line.

4. The display panel as claimed in claim 2, wherein the first power supply voltage bonding terminal and the second power supply voltage bonding terminal are located on a first side and a second side of the display panel adjacent to each other, respectively, the first power line comprises a plurality of first sub-power lines disposed with intersection, the plurality of first sub-power lines comprise a plurality of first connecting nodes, in a direction from the first side pointing to an opposite side of the first side and in a direction from the second side pointing to an opposite side of the second side, a number of the plurality of first connecting nodes increases sequentially, the second power line comprises a plurality of second sub-power lines disposed with intersection, the plurality of second sub-power lines comprise a plurality of second connecting nodes, in the direction from the first side pointing to the opposite side of the first side and in the direction from the second side pointing to the opposite side of the second side, a number of the plurality of second connecting nodes increases sequentially, and the first light-emitting unit and the second light-emitting unit are connected to a corresponding first sub-power line and a corresponding second sub-power line.

5. The display panel as claimed in claim 1, wherein the first power supply voltage bonding terminal and the second power supply voltage bonding terminal are located on a same side of the display panel.

6. The display panel as claimed in claim 5, wherein the first power line comprises a plurality of first sub-power lines, the second power line comprises a plurality of second sub-power lines in parallel, each of the first sub-power lines is parallel to a corresponding second sub-power line, and the first light-emitting unit and the second light-emitting unit are connected between a corresponding first sub-power line and a corresponding second sub-power line.

7. The display panel as claimed in claim 5, wherein the display panel comprises a third side and a fourth side adjacent to the same side, the third side is disposed opposite to the fourth side, the first power line comprises a plurality of first sub-power lines disposed with intersection, the plurality of first sub-power lines comprise a plurality of first connecting nodes, in a direction from the same side pointing to an opposite side of the same side and in a direction from the third side pointing to the fourth side, a number of the plurality of first connecting nodes increases sequentially, the second power line comprises a plurality of second sub-power lines disposed with intersection, the plurality of second sub-power lines comprise a plurality of second connecting nodes, and in the direction from the same side pointing to the opposite side of the same side and in a direction from the fourth side pointing to the third side, a number of the plurality of second connecting nodes increases sequentially.

8. The display panel as claimed in claim 1, wherein the first power line and the second power line are located in a display area of the display panel.

9. The display panel as claimed in claim 1, further comprising a driving chip, wherein the first power supply voltage bonding terminal and the second power supply voltage bonding terminal are connected to the driving chip through a fan-out wiring, and each of the light-emitting units is a light-emitting diode.

10. An electronic device, comprising a display panel, wherein the display panel comprises:
  a first power supply voltage bonding terminal and a second power supply voltage bonding terminal;
  a first power line and a second power line; and
  a plurality of light-emitting units comprising a first light-emitting unit and a second light-emitting unit adjacent to each other, wherein the first light-emitting unit is connected to the first power supply voltage bonding terminal through a first part of the first power line and connected to the second power supply voltage bonding terminal through a first part of the second power line, and the second light-emitting unit is connected to the first power supply voltage bonding terminal through a second part of the first power line and connected to the second power supply voltage bonding terminal through a second part of the second power line;
  wherein when resistance of the first part of the first power line is greater than resistance of the second part of the first power line, resistance of the first part of the second power line is less than resistance of the second part of the second power line.

11. The electronic device as claimed in claim 10, wherein the first power supply voltage bonding terminal and the second power supply voltage bonding terminal are located on different sides of the display panel.

12. The electronic device as claimed in claim 11, wherein the first power supply voltage bonding terminal and the second power supply voltage bonding terminal are located on opposite sides of the display panel, the first power line comprises a plurality of first sub-power lines, the second power line comprises a plurality of second sub-power lines, each of the first sub-power lines is parallel to a corresponding second sub-power line, and the first light-emitting unit and the second light-emitting unit are connected between a same first sub-power line and a same second sub-power line.

13. The electronic device as claimed in claim 11, wherein the first power supply voltage bonding terminal and the second power supply voltage bonding terminal are located on a first side and a second side of the display panel adjacent to each other, respectively, the first power line comprises a plurality of first sub-power lines disposed with intersection, the plurality of first sub-power lines comprise a plurality of first connecting nodes, in a direction from the first side pointing to an opposite side of the first side and in a direction from the second side pointing to an opposite side of the second side, a number of the plurality of first connecting nodes increases sequentially, the second power line comprises a plurality of second sub-power lines disposed with intersection, the plurality of second sub-power lines comprise a plurality of second connecting nodes, in the direction from the first side pointing to the opposite side of the first side and in the direction from the second side pointing to the opposite side of the second side, a number of the plurality of second connecting nodes increases sequentially, and the first light-emitting unit and the second light-emitting unit are connected to a corresponding first sub-power line and a corresponding second sub-power line.

14. The electronic device as claimed in claim 10, wherein the first power supply voltage bonding terminal and the second power supply voltage bonding terminal are located on a same side of the display panel.

15. The electronic device as claimed in claim 14, wherein the first power line comprises a plurality of first sub-power lines, the second power line comprises a plurality of second sub-power lines in parallel, each of the first sub-power lines is parallel to a corresponding second sub-power line, and the first light-emitting unit and the second light-emitting unit are connected between a corresponding first sub-power line and a corresponding second sub-power line.

16. The electronic device as claimed in claim 14, wherein the display panel comprises a third side and a fourth side adjacent to the same side, the third side is disposed opposite to the fourth side, the first power line comprises a plurality of first sub-power lines disposed with intersection, the plurality of first sub-power lines comprise a plurality of first connecting nodes, in a direction from the same side pointing to an opposite side of the same side and in a direction from the third side pointing to the fourth side, a number of the plurality of first connecting nodes increases sequentially, the second power line comprises a plurality of second sub-power lines disposed with intersection, the plurality of second sub-power lines comprise a plurality of second connecting nodes, and in the direction from the same side pointing to the opposite side of the same side and in a direction from the fourth side pointing to the third side, a number of the plurality of second connecting nodes increases sequentially.

17. The electronic device as claimed in claim 10, wherein the first power line and the second power line are located in a display area of the display panel.

18. The electronic device as claimed in claim 10, wherein the display panel further comprises a driving chip, the first power supply voltage bonding terminal and the second power supply voltage bonding terminal are connected to the driving chip through a fan-out wiring, and each of the light-emitting units is a light-emitting diode.

19. The electronic device as claimed in claim 10, wherein the display panel is a light-emitting diode display panel.

20. The electronic device as claimed in claim 10, wherein the first power line is led into the display panel through the first power supply voltage bonding terminal, and the second power line is led into the display panel through the second power supply voltage bonding terminal.

* * * * *